United States Patent [19]

Carpenter et al.

[11] 3,805,098

[45] Apr. 16, 1974

[54] QUARTZ-CRYSTAL MOUNTING ASSEMBLY

[75] Inventors: John J. Carpenter, Lynbrook; Charles C. Spreckles, Huntington, both of N.Y.

[73] Assignee: Bulova Watch Company, Inc., New York, N.Y.

[22] Filed: Jan. 23, 1973

[21] Appl. No.: 325,996

Related U.S. Application Data

[63] Continuation-in-part of Ser. No. 204,177, Dec. 2, 1971.

[52] U.S. Cl. .................... 310/9.1, 310/8.2, 310/9.4

[51] Int. Cl. .................... H01v 17/00

[58] Field of Search .................... 310/8.2, 8.9, 9.1–9.4

[56] References Cited

UNITED STATES PATENTS

| | | | |
|---|---|---|---|
| 2,559,494 | 7/1951 | Brown, Jr. | 310/9.4 |
| 3,069,572 | 12/1962 | Dick et al. | 310/9.4 X |
| 3,185,870 | 5/1965 | Stoddard et al. | 310/9.4 X |

*Primary Examiner*—J. D. Miller
*Assistant Examiner*—Mark O. Budd

[57] ABSTRACT

A crystal mounting assembly provided with a hermetically sealed and evacuated envelope in which a crystal unit is supported on a rigid ceramic substrate by means of strain-free leads connecting the crystal electrodes to contacts plated on the substrate. The substrate contacts are connected to terminal pins projecting from the envelope, the inner ends of the pin passing through holes in the substrate and then being crooked before being joined to the contacts to provide a resilient suspension for the substrate whereby the lead-supported crystal is mechanically isolated from and unaffected by stresses imposed on the pins and whereby the pins are isolated from the vibrating crystal.

6 Claims, 10 Drawing Figures

QUARTZ-CRYSTAL MOUNTING ASSEMBLY

RELATED APPLICATION

This application is a continuation-in-part of out copending application entitled CRYSTAL MOUNTING ASSEMBLY, Ser. No. 204,177 filed Dec. 2, 1971.

BACKGROUND OF THE INVENTION

This invention relates generally to piezoelectric crystal units, and more particularly to a mounting assembly for protectively housing a crystal unit.

Piezoelectric crystal units are high-Q resonators that serve as stable frequency standards. In recent years, such standards have been employed as a time base in electronic watches, the frequency of the crystal being divided down electronically to provide low-frequency pulses for operating a time display. One such crystal-controlled timepiece is disclosed in the copending application of Mutter and Gruner, entitled ELECTRONIC SYSTEM MODULE FOR CRYSTAL-CONTROLLED WATCH, Ser. No. 204,000, filed Dec. 2, 1971.

In order to obtain stable oscillations at an assigned frequency, not only is a precisely-dimensioned crystal unit essential, but it is also necessary that the crystal be mounted in a manner which protects or isolates it from varying environmental conditions that may adversely influence its frequency or Q.

It is desirable, therefore, that the crystal mounting have a low mechanical impedance and yet sufficient rigidity so that the crystal unit, when subjected to mechanical shock, will not change its characteristics as an oscillator. It is likewise desirable that the crystal unit be supported within an evacuated, hermetically-sealed container.

An evacuated container not only eliminates losses caused by ultrasonic radiation into the air, but it also prevents air loading, contamination, moisture and other deleterious factors from affecting the crystal. The Q of a crystal unit in vacuum is much higher than in air.

When a crystal frequency standard is employed as a time base in a watch, space limitations are such as to dictate a miniaturized crystal mounting assembly. This creates serious mounting problems. In making miniature crystal assemblies, it has heretofore been the practice to mount the crystal unit within a small metal envelope provided with terminal pins which project from the envelope, the ends of the pins within the envelope being connected to leads extending to the electrodes on the crystal unit and serving to support the unit within the envelope. After the envelope is evacuated, its junctions or seams are sealed by soldering or welding. Soldering or heat-welding has been found to be objectionable, for the fumes generated by these techniques are trapped within the envelope, and contaminants evolving from the soldering materials settle on the crystal surface. As a consequence, the Q of the crystal is adversely affected, and the frequency thereof may be shifted slightly. A slight shift in frequency is sufficient to render the timepiece inaccurate.

In order to avoid these harmful effects, the more recent practice has been to use high-pressure cold-welding techniques for closing the seams of the envelope. Cold-welding has the advantage of being free from fumes and contaminants. However, the pressures entailed by this technique are such as to give rise to distortion of the envelope, as a result of which the terminal pins may be displaced from their original envelope positions.

The displacement of the pins is transmitted by the leads connected thereto to the crystal unit supported by the leads, as a result of which a stress force is applied which strains the crystal unit and brings about a slight change in frequency. This frequency change renders the crystal assembly unacceptable, particularly in the case of an electronic timepiece whose accuracy is entirely dependent on having the crystal frequency at an assigned value.

Moreover, the physical structure of the metal envelope is affected by changes in ambient temperature, and this too produces shifts in the position of the pins, which are transmitted to the leads and impose a strain on the crystal unit. Hence in the manufacture of crystal-controlled timepieces, it is not sufficient to provide a precisely-dimensioned crystal unit, for unless this unit is properly mounted, it will not yield the desired time-base frequency.

In our copending application, above-identified, there is disclosed an improved crystal mounting assembly in which the crystal unit is housed within an evacuated envelope having terminal pins projecting therefrom, and which is effectively isolated from various environmental conditions, including mechanical forces imposed on the envelope, which tend to displace the pin positions. This is accomplished by means of strain-free leads connected to the electrodes of the crystal and attached to plated contacts on a rigid substrate seated within the envelope, the contacts being joined to the inner ends of the terminal pins whereby the leads are mechanically isolated from the pins and substantially unaffected by changes in pin position.

But while the leads constitute a spring system serving to isolate the crystal supported thereby, the substrate is rigidly connected to the pin and is not mechanically isolated therefrom; hence heavy stresses imposed on the pins are transmitted to the substrate and under some conditions may in turn be absorbed by the crystal with detrimental effects.

Moreover, it has been found that in practice, it is almost impossible to consistently terminate all leads from the crystal on to the substrate so that there is no energy transferred to the substrate through the leads from the vibrating crystal. Because of such transfer, the pins are caused to vibrate, and when these pins are subsequently soldered or otherwise connected to a circuit associated with the crystal, a shift in crystal frequency is experienced.

SUMMARY OF THE INVENTION

In view of the foregoing, it is the main object of this invention to provide an improved crystal mounting assembly in which the crystal unit is housed within an evacuated envelope having terminal pins projecting therefrom, and which by means of two spring systems is effectively isolated from all environmental conditions, including mechanical forces imposed on the envelope, which tend to displace the pin positions.

A significant feature of the invention is that the isolation between the crystal and the pins serves to prevent excitation of the pins by the vibrating crystal.

More particularly, it is an object of this invention to provide a crystal mounting assembly of the above type, in which the crystal is supported by strain-free leads connected to the crystal electrodes and attached to plated contacts on a rigid substrate disposed within the envelope, the leads constituting a first spring system. The contacts are connected by a second spring system to the terminal pins, whereby the crystal is mechanically isolated by the first and second spring systems from the pins and is unaffected by changes in pin position and whereby the pins are mechanically isolated from the vibrating crystal.

Yet another object of the invention is to provide a crystal mounting assembly which is insensitive to ambient temperature changes.

It is also an object of the invention to provide a miniature crystal mounting assembly suitable for an electronic watch, which may be manufactured at relatively low cost, which is efficient and reliable in operation, and which has a stable operating frequency that is unaffected by the varying environmental conditions encountered in a watch.

Briefly stated, these objects are attained in a crystal mounting assembly including an envelope having a flanged base section and a flanged cover section which are joined together and hermetically sealed by cold-welding the flanges. A pair of terminal pins project from the base section. Seated within the base section is a ceramic stiffener plate having a zero-temperature coefficient of expansion, the upper surface of the plate having contacts plated thereon. The inner ends of the pins pass through oversize openings in the stiffener plate and are crooked before being joined to the contacts on the upper surface of the plate to define a resilient suspension therefor.

Mounted above the plate is a crystal unit whose electrodes are connected at nodal points to unstrained leads which serve to resiliently support the crystal unit, the ends of the leads being connected to the contacts on the substrate whereby the leads constitute a spring system. Thus the crystal is doubly isolated from the environmental forces by two spring systems, one being formed by the leads and the other by the plate suspension, and at the same time the pins are isolated from the vibrating.

Consequently any mechanical energy transferred from the crystal to the substrate is absorbed by the spring system suspending the substrate.

OUTLINE OF THE DRAWINGS

For a better understanding of the invention, as well as other objects and further features thereof, reference is made to the following detailed description to be read in conjunction with the annexed drawings, wherein:

FIG. 1 is a perspective view of a crystal mounting assembly in accordance with the invention;

FIG. 2 separately shows the cover of the assembly envelope;

FIG. 3 separately shows the base of the envelope with the stiffener substrate and the crystal unit seated therein;

DESCRIPTION OF THE INVENTION

Figures 1, 2, 3, 4, 5:
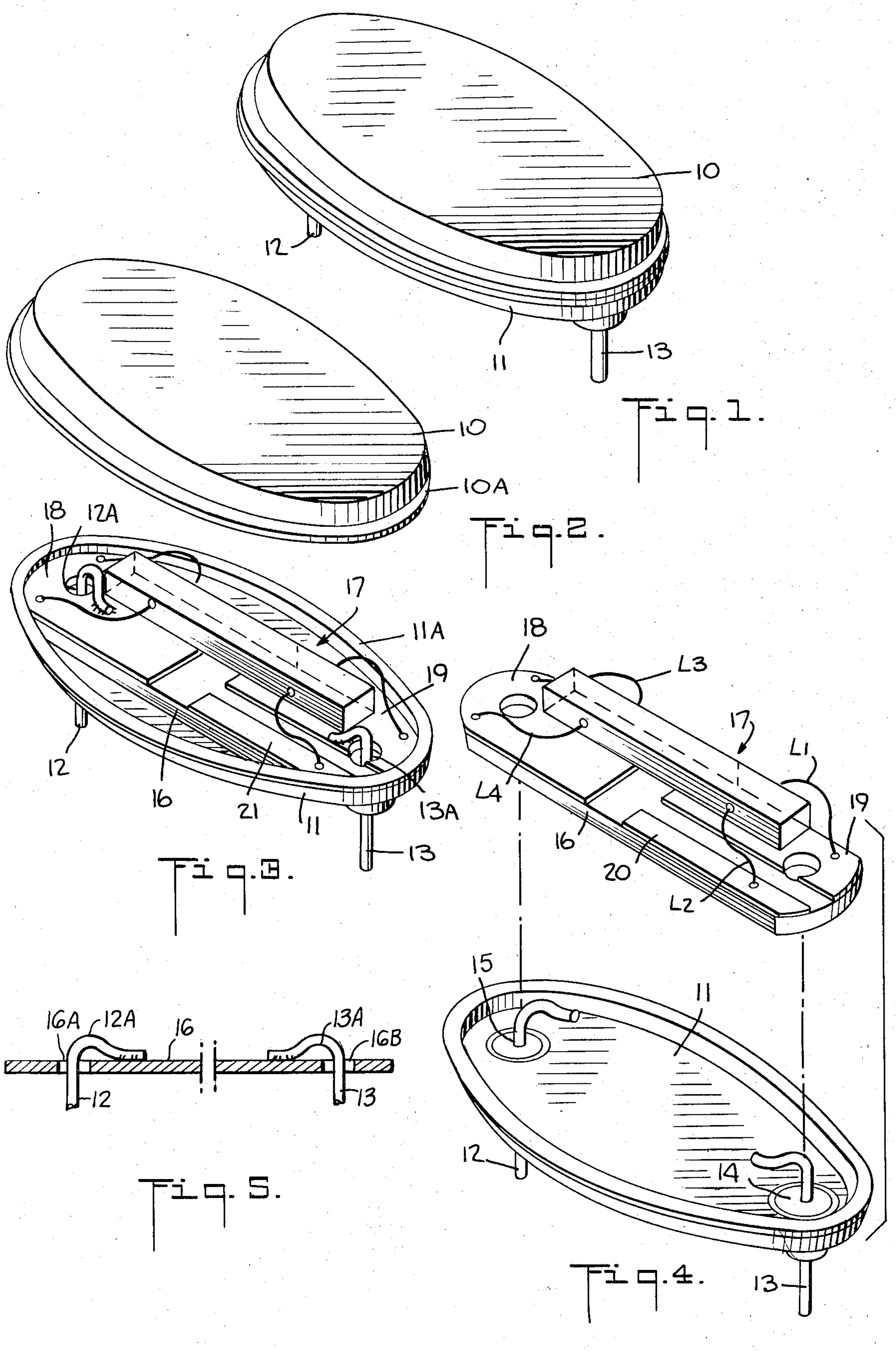
FIG. 4 is an exploded view of the arrangement shown in FIG. 3.
FIG. 5 is a section taken through the stiffener substrate.

Referring now to FIG. 1, there is shown a crystal mounting assembly in accordance with the invention, the assembly including an evacuated metal envelope, preferably formed of a non-ferromagnetic material such as aluminum. The envelope is constituted by a cover section 10 having an elliptical formation, welded or otherwise bonded to a similarly-shaped base section 11.

Cover section 10, as best seen in FIG. 2, is provided with a peripheral flange 10A that exactly complements the peripheral flange 11A formed in base section 11 (see FIGS. 3 and 4). The flanges on the two sections are united, so that the envelope defined by the joined sections is hermetically sealed. The joining together of the flanges is preferably carried out by a high-pressure cold-welding technique that avoids fumes and contaminants.

Projecting downwardly from the floor of base section 11 is a pair of terminal pins 12 and 13, anchored in glass-to-metal seals 14 and 15, respectively, which insulate the pins from the metal envelope. Suspended within base section 11 is a generally rectangular stiffener plate 16 whose ends are rounded to conform to the rounded ends of the base section. Plate 16, which is preferably formed of ceramic material, such as alumina or other rigid, high-strength insulating material, acts as a substrate for a piezoelectric crystal unit, generally designated by numeral 17.

Electroplated or otherwise formed on the top surface of stiffener plate 16 are three conductive layers 18, 19 and 20 which serve as electrical contacts. Layer 18 entirely covers one end portion of the top surface, whereas layers 19 and 20, which together cover the other end portion, are spaced apart by a longitudinal channel so that these layers define separate contacts.

The inner end 12A of terminal pin 12 passes through an oversize bore 16A in plate 16, the end then being given a crooked formation before being soldered to contact 18. The inner end 13A of terminal pin 13 goes through another oversize bore 16B in plate 16, and is given a crooked formation before being soldered to contact 19. No terminal pin is provided for layer 20, for reasons which will be later explained. The crooked inner ends 12A and 13A of the terminal pins function to resiliently suspend stiffener plate 16 within base section 11A of the envelope and constitute a compliant spring system serving to mechanically isolate the plate.

Figures 6, 7, 8, 9, 10:
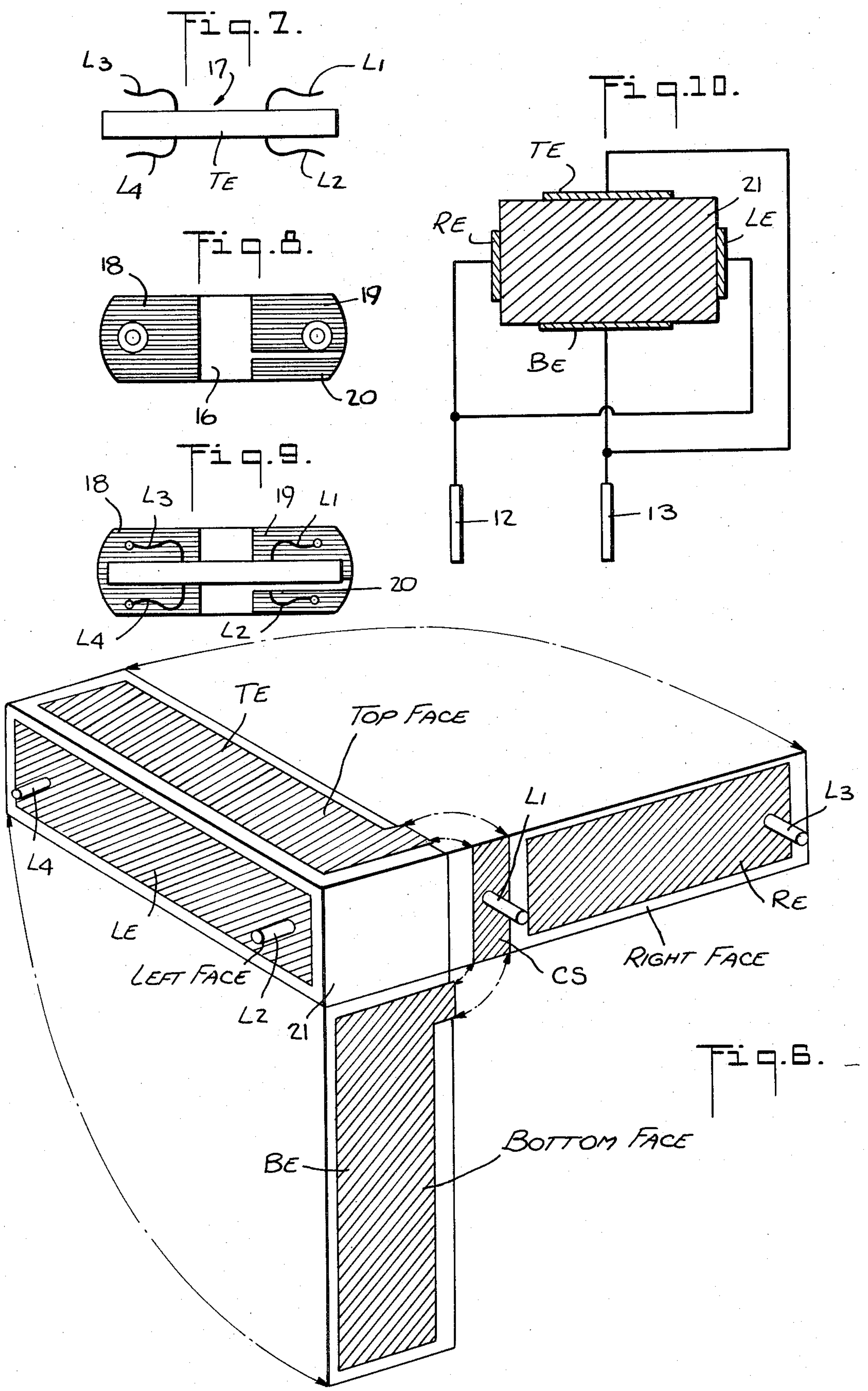
FIG. 6 is a perspective view of the crystal unit, the hidden right and bottom faces thereof being rotated to bring them into view.
FIG. 7 is a plan view of the crystal unit and the supporting leads therefor.
FIG. 8 is a plan view of the substrate.
FIG. 9 is a plan view of the crystal unit mounted on the substrate.
FIG. 10 is a schematic view of the electrode connections for the crystal unit.

Crystal unit 17, as shown separately in FIG. 6, is composed of a bar-shaped piezoelectric crystal element whose ends are unplated but whose four faces are metallized in a particular pattern to define electrodes.

As is well known, the simplest crystal cuts are the X and Y cuts. An X-cut crystal body vibrates in a thickness extensional mode wherein the large surfaces of the crystal plate move apart and come together. The Y-cut plate vibrates in a thickness shear mode, wherein the upper surface alternately slides one way and then the other, as the lower surface moves similarly in the opposite direction.

The bar-shaped crystal element 21, which is in the form and cut preferred for inclusion in the assembly, is an X-Y cut crystal operating in the flexion mode. The crystal element is supported over substrate 16 by leads connected thereto at nodal points to avoid withdrawing energy from the crystal.

The advantage of an X-Y cut crystal is that it makes it possible with a crystal of tiny dimensions to operate at a relatively low frequency in a range suitable for electronic timepieces. Thus in one actual embodiment of the invention, an X-Y cut crystal operating at a frequency of 32,768 Hz, has the following dimensions: length—about three-eighths inch; width—about one-sixteenth inch; thickness—about one thirty-second inch. Since the envelope dimensions are such as to encompass this tiny crystal bar, the overall size of the assembly is quite small and lends itself to inclusion in a crystal-controlled timepiece.

Another significant advantage of the X-Y cut crystal is that its temperature coefficient of frequency over the temperature range normally encountered in watches is substantially flat — hence there is no need to compensate the crystal frequency for temperature variations.

A so-called "zero" temperature-coefficient crystal is one having a very small temperature coefficient over a very wide range (0° to 100° C). This is true only of a GT cut crystal. All other crystals have parabolic characteristics, such that at the turn-over point, the slope of the frequency-temperature curve is zero. At this point, no change occurs with very small changes in temperature. In other words, the crystal has a zero temperature coefficient of frequency at a single temperature only.

This zero-temperature coefficient of frequency occurs in an X-Y cut crystal at about 30° C, which is close to body temperature. Hence when the X-Y cut crystal is included in a watch worn on the wrist, it effectively operates with a zero-temperature coefficient of frequency. The range at which substantially no frequency change occurs in an X-Y cut crystal extends about 10° C above and 10° below 30° C (i.e., from 20° to 40°). As a practical matter, therefore, even when the crystal watch is not being worn, the frequency of its X-Y cut crystal is not significantly affected by ordinary changes in ambient temperature.

In order to properly energize the X-Y cut crystal in an oscillator circuit, one must apply voltages between the two pairs of faces in the manner shown schematically in FIG. 10. This Figure shows crystal 21 provided with top and bottom electrodes TE and BE plated on the top and bottom faces thereof, and left and right electrodes LE and RE plated on the left and right faces thereof. The ends of the crystal element are free of electrodes.

In order to electrically stress the X-Y cut crystal, the top and bottom electrodes TE and BE are interconnected and go to terminal pin 13, and the left and right electrodes LE and RE are interconnected and go to terminal pin 12. Hence the electric field is established between the top-bottom electrode pair and the left-right electrode pair.

The metal-plating pattern formed on the faces of the crystal to define the electrodes and the connections therebetween, is illustrated in FIG. 6. It will be seen that the plating on both the top and bottom faces forming electrodes TE and BE creates a rectangular layer whose periphery is inwardly displaced from the edges of the top and bottom surfaces of the crystal. These two rectangular layers are joined by a narrow connecting strip CS running along the right face of the crystal adjacent one end of the crystal bar.

The left electrode LE is a rectangular layer extending over the entire surface of the left face except for the margins thereof, whereas the similar right electrode RE is somewhat shorter to allow room for the connecting strip CS. Thus the right and left electrodes are not interconnected on the crystal bar and must be externally connected to provide the circuit of FIG. 10.

The connections between the crystal electrodes and the pins are effected, as shown in FIGS. 3, 7, 8 and 9, by four wire leads $L_1$, $L_2$, $L_3$ and $L_4$, which are symmetrically arranged and connected to the electrodes at nodal points on the crystal, each lead having the formation of a question mark.

One end of lead $L_1$ is connected at a nodal point to the connecting strip CS, and hence electrically to both the top and bottom electrodes TE and BE. The other end of lead $L_1$ is connected to contact 19 on the substrate and hence to pin 12.

One end of lead $L_2$ is connected at a nodal point to left electrode LE, the other end of this lead being connected to contact 20 on the substrate. This contact is electrically isolated from the other contacts, and goes to no terminal pin. Hence lead $L_2$ performs only a support function and acts as one of the four symmetrically arranged resilient feet maintaining the crystal unit at its proper position above substrate 16.

Lead $L_3$ is connected at one end at a nodal point to right electrode RE, and at the other end to contact 18. Lead $L_4$ is connected at one end to left electrode LE at a nodal point and at the other end to the same contact 18. Contact 18 therefore serves to interconnect the left and right electrodes RE and LE and to connect these electrodes to terminal pin 12.

The connection of the ends of the leads to the electrodes in the crystal is preferably carried out by a thermo-compression technique rather than by soldering. The reason for this is that thermo-compression acts to weld the head or tip of the lead to the electrode surface at the nodal point thereon, without effectively broadening the tip, as would be the case with a soldered joint where the tip is surrounded with a mound of solder that acts to extend the connection area beyond the nodal point, as a consequence of which, energy is transmitted to the lead.

In soldering the other end of each electrode lead to its proper contact on the substrate, it is important that the lead be permitted to "float" before it is soldered in place in order to avoid any strain on the lead that might be transmitted to the crystal. That is to say, the shape or orientation of the lead must be such that no further bending is required to bring it to its point of connection, for if bending is necessary, it will create strain forces.

In the crystal assembly, the rigid substrate on which the crystal unit is mounted by strain-free leads serving as resilient supporting feet as well as electrical connections, acts to isolate the crystal unit from any mechanical forces which deform the envelope and shift the pin positions. The mounted crystal unit in the evacuated envelope is therefore unstrained, it is free of contaminants and operates at high Q in vacuo at a frequency precisely determined by its dimensions. Thus the crystal is mechanically isolated from stress forces by two spring systems, one being formed by the crooked ends of the pins which suspend the stiffener plate and the second by the leads which support the crystal above the plate. At the same time, the terminal pins are mechanically isolated from the vibrating crystal, for energy transferred from the vibrating crystal to the stiffener plate by the crystal leads is absorbed in the spring system suspending this plate.

While there has been shown and described a preferred embodiment of crystal mounting assembly in accordance with the invention, it will be appreciated that many changes and modifications may be made therein without, however, departing from the essential spirit of the invention.

We claim:

1. A crystal mounting assembly comprising:

A. an evacuated metal envelope having a base section and a cover section joined thereto, said cover section having a generally flat bottom;

B. first and second terminal pins passing through and projecting upwardly from the base section, said pins being insulated from the envelope;

C. a rigid insulating plate suspended within said base section in parallel relation to said flat bottom, said plate having at least two contacts plated on the top surface thereof, the inner ends of said pins passing through oversize bores in said plate and being crooked before being connected to said contacts, said crooked pin ends functioning as a resilient suspension for said plate within said base section;

D. a bar-shaped piezoelectric crystal unit having electrodes thereon; and

E. strain-free leads for resiliently supporting said unit lengthwise above said plate in parallel relation thereto, said leads being connected between said electrodes and said contacts.

2. As assembly as set forth in claim 1, wherein said face and cover sections have complementary peripheral flanges formed therein which are cold welded together.

3. An assembly as set forth in claim 1, wherein said pins are anchored on the floor of said base section by glass-to-metal seals.

4. An assembly as set forth in claim 1, wherein said plate is formed of ceramic material having a zero limitation coefficient of expansion.

5. An assembly as set forth in claim 1, wherein said crystal is provided with an X-Y cut crystal element.

6. An assembly as set forth in claim 5, wherein the faces of said element have electrodes plated thereon, the top and bottom face electrodes being interconnected by a strip plated along one side face of said element, the left and right face electrodes being disconnected on the element.

* * * * *